United States Patent
Thomas et al.

(10) Patent No.: US 6,665,215 B2
(45) Date of Patent: Dec. 16, 2003

(54) MEMORY CELL READ DEVICE WITH A PRECHARGE AMPLIFIER AND ASSOCIATED METHODS

(75) Inventors: Sigrid Thomas, Grenoble (FR); Leïla Aitouarab, Grenoble (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 10/117,448

(22) Filed: Apr. 5, 2002

(65) Prior Publication Data

US 2002/0176298 A1 Nov. 28, 2002

(30) Foreign Application Priority Data

Apr. 6, 2001 (FR) ............................................. 01 04750

(51) Int. Cl.[7] ............................................. G11C 16/04
(52) U.S. Cl. .................. 365/185.25; 365/202; 365/203; 365/208; 365/185.21
(58) Field of Search .......................... 327/53, 56, 205, 327/206; 365/202, 203, 207, 208, 210, 185.2, 185.21, 185.25

(56) References Cited

U.S. PATENT DOCUMENTS

| 4,881,203 | A | * | 11/1989 | Watanabe et al. ............ 365/203 |
| 4,897,569 | A |   | 1/1990  | Calzi .......................... 307/530 |
| 5,305,272 | A |   | 4/1994  | Matsuo et al. ............... 365/208 |
| 5,506,522 | A | * | 4/1996  | Lee .............................. 327/53 |
| 5,761,134 | A | * | 6/1998  | Masuda et al. ......... 365/189.05 |
| 6,122,210 | A |   | 9/2000  | Fujii .......................... 365/203 |
| 6,456,549 | B1 | * | 9/2002 | Sudo et al. .................. 365/207 |

* cited by examiner

*Primary Examiner*—Son Mai
(74) *Attorney, Agent, or Firm*—Lisa K. Jorgenson; Allen, Dyer, Doppelt, Milbrath & Gilchrist, P.A.

(57) ABSTRACT

In a device for reading memory cells, a precharging circuit is connected to a memory cell to be read and to a reference cell associated with the memory cell to be read. The precharging circuit precharges the output of the differential amplifier to a predetermined voltage level. The reading device further includes an inverter having a high threshold and a low threshold connected to the output of the differential amplifier. The predetermined voltage level corresponds to an intermediate level between the high and low thresholds.

23 Claims, 3 Drawing Sheets

MEMORY CELL READ DEVICE WITH A PRECHARGE AMPLIFIER AND ASSOCIATED METHODS

FIELD OF THE INVENTION

The present invention relates to memories, and more particularly, to a device for reading memory cells within a memory. The device can be applied especially to the reading of non-volatile memories, as well as to SRAMs or other types of memories.

BACKGROUND OF THE INVENTION

As can be seen in a diagrammatic view in FIG. 1, a reading device usually has a differential amplifier 1. An input node e1 of the amplifier 1 is connected by a current/voltage converter circuit 2 to a bit line B1 to which a memory cell Cmem to be read is connected. The other input node e2 of the amplifier 1 is connected by another current/voltage converter circuit 3 to a reference bit line Blref to which a reference cell Cref is connected.

The reading device furthermore usually comprises a current generator 4 to generate current for reading and precharging of the bit lines. In the precharging phase, the converter circuits 2 and 3, which form an automatic control loop, fix the bit line precharging voltage level at the read voltage level, which is typically in the range of one volt, before activating the reading mode (READ). The read current is usually given by a current mirror which imposes a fraction of the reference bit line read current on the bit line selected in the read mode. Such devices are well known to those skilled in the art.

The inputs e1 and e2 of the amplifier 1 are in an indeterminate state when the reading is activated. Thus, depending on the state of the cell selected for reading, and depending on the initial state of the amplifier, the data is available at the output after a certain period of time. Either the state of the cell (as compared with that of the reference cell) corresponds to the initial state of the amplifier and the output of the amplifier is already correct, or the state of the cell corresponds to the reverse state and the amplifier has to switch over. Furthermore, the differential amplifier 1 switches over faster in one direction than in another. Hence, the circuit (the processor) that has initiated the read access can have the data available at the output of the device only after a certain period of time, which is determined with respect to the worst-case read time.

Furthermore, since the bit line selected in the read mode and the reference bit line are precharged at the same voltage level, if the current difference between the two lines is small in the read phase, the voltage difference between the two inputs e1 and e2 of the differential amplifier may be very small, and above all, it may build up very slowly. The output voltage level of the differential amplifier is then incorrect (there is an offset of the differential amplifier) and does not represent the direction of variation of the input voltage e1, e2 of the amplifier.

SUMMARY OF THE INVENTION

In view of the foregoing background, an object of the present invention is to improve the speed of reading a memory.

There are known reading devices that include circuits for the asymmetrical precharging of the inputs of the differential amplifier, so as to position this amplifier in a known state. This known state is preferably such that the switch-over from this known state into the complementary state corresponds to the fastest switching of the amplifier. The reading speed is thus improved. The fact remains that, in certain applications, the switching speed obtained is unsatisfactory.

In the present invention, instead of precharging the inputs of the amplifier, a precharging of the output is done so as to set the output of the amplifier preferably at an intermediate voltage level between the low logic level and the high logic level. Thus, the output of the amplifier is preferably precharged at Vdd/2. The time at the end of which the data is available at output is then smaller, since the output thereafter has only half the path to be taken to make its precharging state pass into the final state, a logic 0 or 1.

It is then possible to provide a circuit to balance the inputs e1, e2 of the amplifier. This circuit is activated in the precharging phase and is deactivated before the amplifier output precharging circuit, so that the inputs begin to build up to overcome the offset effect. Thus, when the output precharging circuit is deactivated, the output switches into the state corresponding to the data read in the selected cell.

Another problem encountered especially with the reading of SRAM memory cells is the presence of indeterminate voltage levels or glitches at an output of the read device. These glitches appear at an output of the amplifier when data is read several times in succession at the same memory address (i.e., when there is a multiple reading).

Each read cycle starts with a precharging phase during which the read amplifier provides information independent of the state of the memory cells, raising a problem of synchronization. In the case of the multiple readings of the same memory word, the data read between two read access operations is lost.

This is highly inconvenient for the data processing by the circuit that has requested the reading since it is an asynchronous processor. This circuit should not take the data at the output when this output data is indeterminate. Otherwise, false data will be read.

In the invention, this problem is advantageously addressed by placing a Schmitt trigger, namely an inverter circuit with thresholds or a hysteresis circuit, downstream from the circuit for precharging the output of the read differential amplifier. The output of the amplifier is precharged at an intermediate level between the two thresholds, namely the high and low threshold of the trigger circuit.

This inverter circuit with thresholds is placed after the circuit for precharging the output of the amplifier. The inverter circuit will filter (mask) the intermediate voltage level between its two thresholds, since once it has switched over in one direction, for example, once the output of the amplifier has gone above the high threshold of the threshold converter circuit, this circuit will switch into the other direction only if the output of the amplifier drops below this low threshold. In general, the high and low thresholds are respectably fixed at ¾ Vdd and ¼ Vdd.

Thus, in the reading device in which there is an inverter circuit with thresholds, combined with the precharging of the output of the differential amplifier at an intermediate level between its two thresholds, there are no longer any glitches at an output of the inverter circuit with thresholds. This inverter circuit with thresholds has a memory effect on the previously read data.

The invention therefore improves the reading speed and the stability of the data at output. As characterized, the invention therefore pertains to a memory cell reading device with a differential amplifier.

According to the invention, this reading device comprises a circuit for precharging the output of the differential amplifier at a predetermined voltage level. Preferably, this precharging circuit positions the output of the amplifier at an intermediate level between the low and high logic levels. This intermediate level is advantageously fixed at half of the logic power supply voltage swing. Preferably, a circuit for balancing the inputs of the differential amplifier is provided. This circuit is activated in the precharging phase and deactivated in the reading phase before the amplifier output precharging circuit.

In one embodiment, an inverter circuit with thresholds is connected to the output of the output precharging circuit. In this case, the predetermined precharging level for the amplifier output is set at an intermediate value between the high and low thresholds of this inverter circuit.

The invention also relates to a memory integrated circuit comprising a reading device of this kind, especially for the reading of SRAM memory cells.

BRIEF DESCRIPTION OF THE DRAWINGS

Other features and advantages of the invention are described in detail in the following description, given by way of a non-restrictive indication with reference to the appended drawings, of which.

DETAILED DESCRIPTION OF THE PREFERRED EMBODIMENTS

Figure 1:
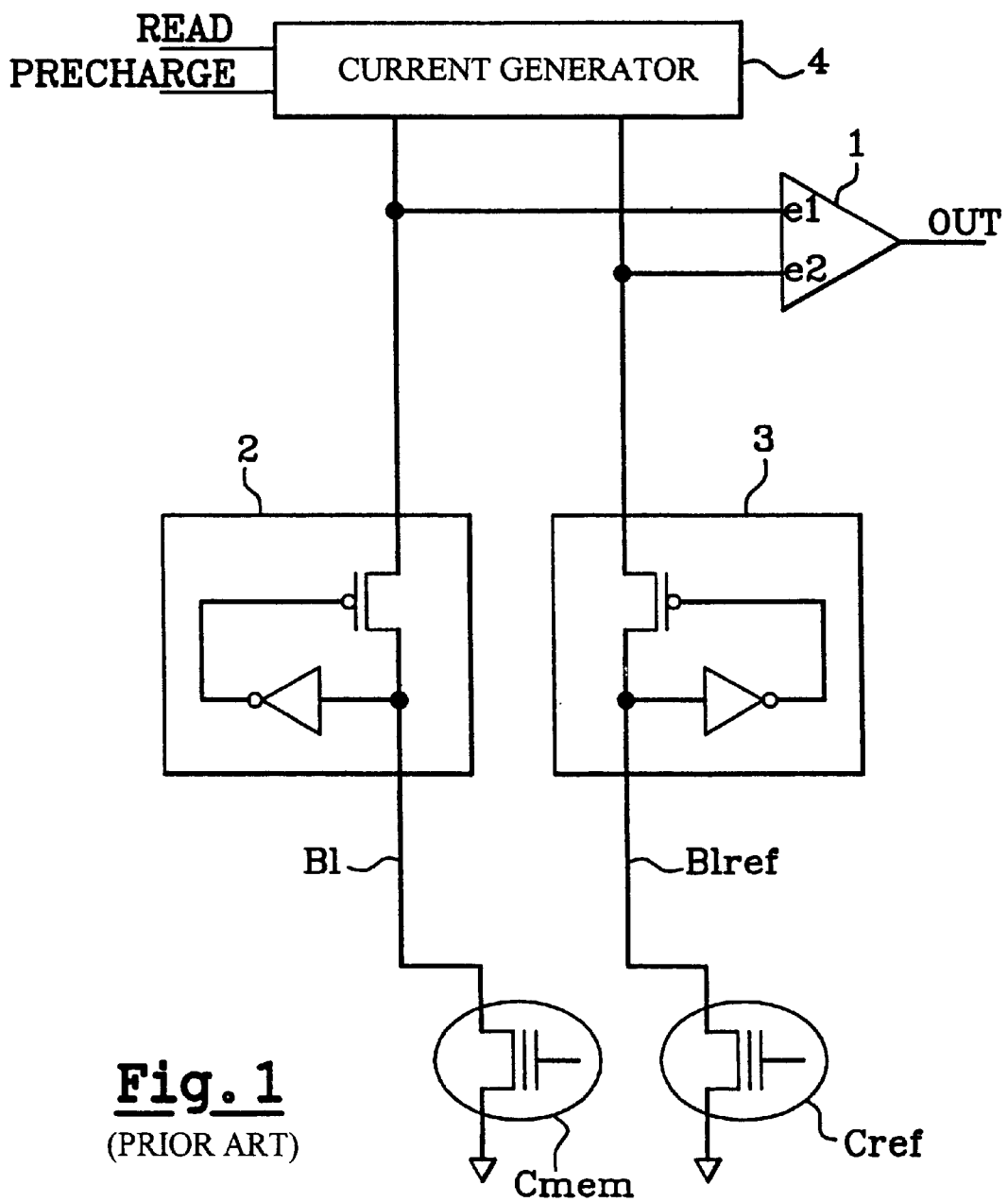
FIG. 1 is a diagrammatic view of a memory cell reading device according to the prior art.
Figure 2:
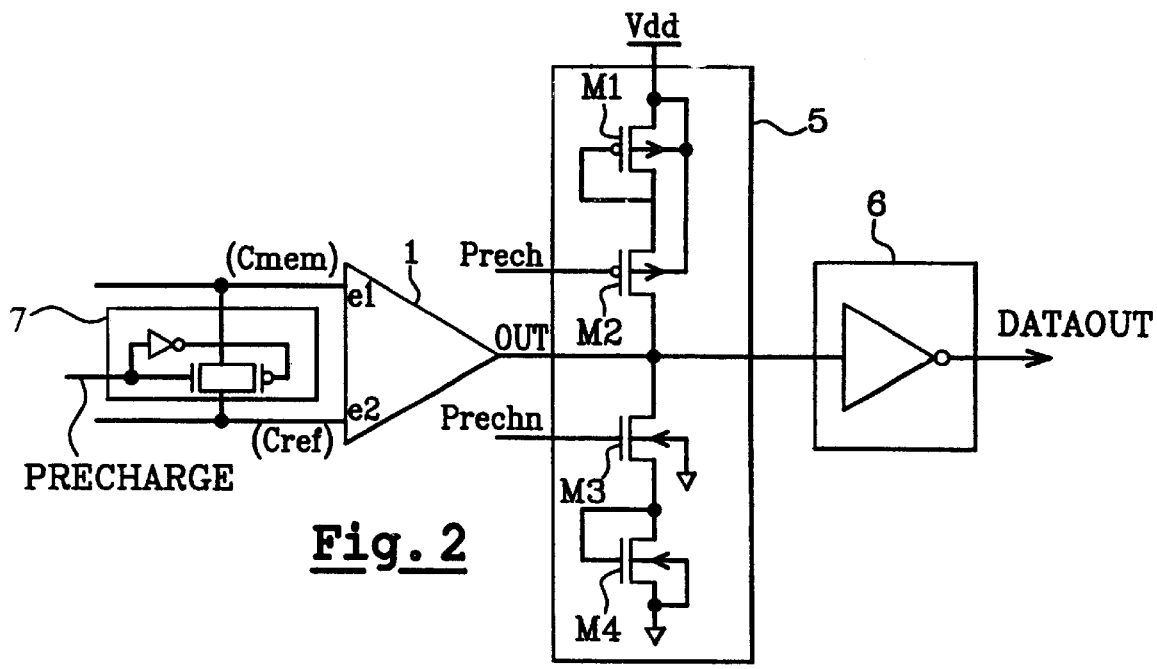
FIG. 2 shows a differential amplifier of a reading device with an output precharging circuit according to the present invention.

FIG. 2 shows the differential amplifier 1 of the reading device followed by a precharging circuit 5 according to the invention. An output stage 6 for reshaping the output signal is provided. This output stage 6 typically comprises at least one inverter.

The precharging circuit 5 is activated by a control signal Prech before the reading phase, to bring the output OUT of the amplifier into a specified state that depends on its inputs e1 and e2. Precharging of the output typically takes place during the usual bit line precharging phase.

The output precharging level corresponds to an intermediate level VI between the two levels, namely the high level and the low level. If we choose VI to be equal to half of the voltage swing between the high logic level and the low logic level, namely Vdd/2 in the example, the output is placed midway between these two logic levels. The subsequent reading is thereby accelerated, in both directions.

An exemplary embodiment corresponding to the precharging circuit 5 is illustrated in FIG. 2. In this example, the precharging circuit comprises an upper arm with PMOS transistors and a lower arm with NMOS transistors. Each arm comprises a diode configured transistor and an activation transistor controlled by a precharging signal.

The upper arm has two PMOS transistors M1 and M2. The transistor M1 has its source connected to the logic power supply voltage Vdd, and is configured as a diode, with its gate connected to its drain. The transistor M2 has its source connected to the drain of the transistor M1. It is controlled at its gate by a precharging signal Prech.

The lower arm has two NMOS transistors M3 and M4. The transistor M3 has its drain connected to the drain of the transistor M2. Its gate is controlled by the inverse precharging signal Prechn. The common drains of the transistors M2 and M3 form the midpoint of this circuit to which the output OUT of the differential amplifier is connected. The transistor M4 has its drain connected to the source of the transistor M3, and its source connected to ground. It is configured as a diode with its gate connected to its drain.

When the system is in the precharging phase, the signal Prech is activated. In the example, it is active at a logic 0. The transistors M2 and M3 become conductive. The transistors M1 and M4 act as current generators. The dimensions of the transistors of the precharging circuit 5 are chosen so that the midpoint of the circuit is set at the intermediate level VI between the two logic levels 0 and Vdd, which in the example is at Vdd/2.

Figure 3:
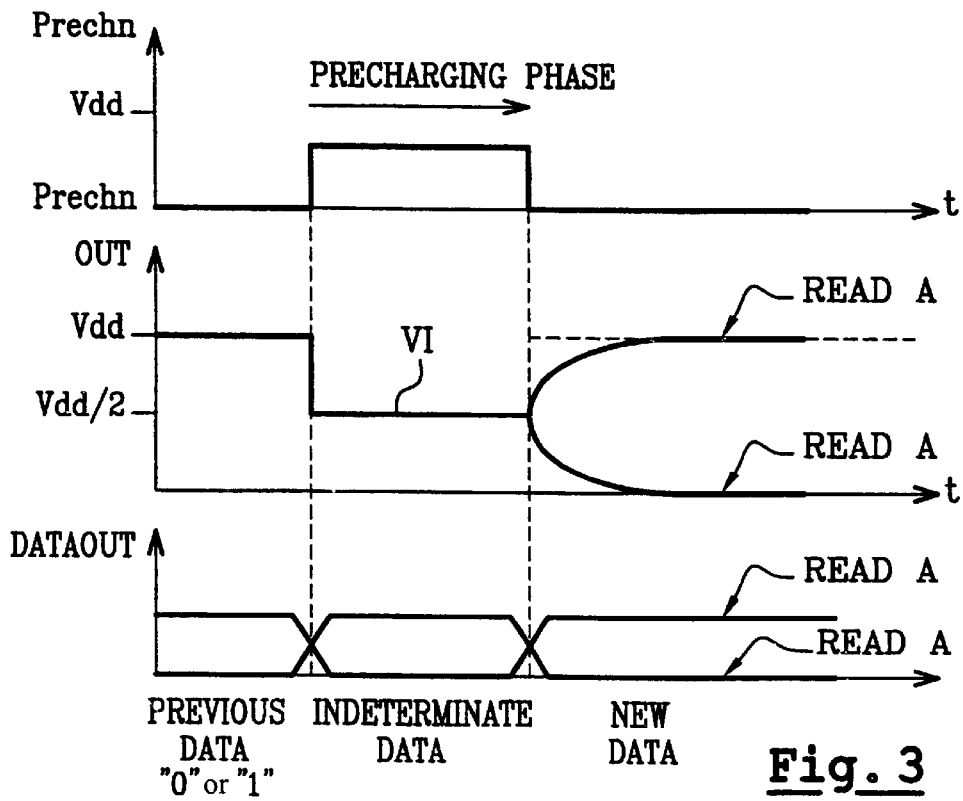
FIG. 3 is a timing diagram of the signals obtained with a reading device according to the present invention.

As can be seen in FIG. 3, the output OUT of the amplifier is then precharged at VI (Vdd/2). In the reading phase, the precharging signal is deactivated. The output OUT is then set at a level corresponding to the levels applied at inputs e1 and e2, either at a logic 0 or at a logic 1. This output is reshaped by the output stage 6 which gives the data read at the output DATAOUT.

So that the output data OUT may be quickly set at the output, a balancing circuit 7 is provided for the balancing of the inputs e1 and e2 of the amplifier. This balancing circuit short-circuits the inputs e1 and e2 to set them at the same level. To compensate for the offset effect of the amplifier 1, this balancing circuit 7, activated in the precharging phase by a signal PRECHARGE, will be deactivated before the output precharging circuit 5.

Figure 4:
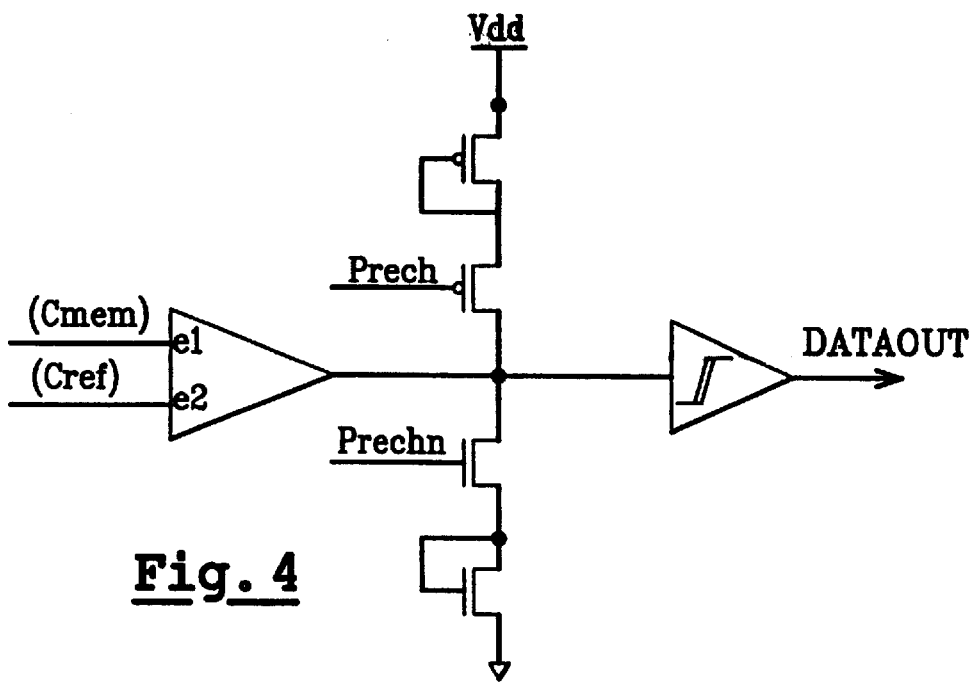
FIG. 4 shows a differential amplifier of a reading device with an output precharging circuit and an inverter with thresholds according to the present invention.

FIG. 4 illustrates a reading device comprising another embodiment according to the invention. In this reading device, the output stage is replaced by an inverter with thresholds, i.e., a Schmitt trigger. In this case, the output precharging level of the amplifier must be at an intermediate level between the high and low thresholds of the inverter. An intermediate level corresponding to half of the logic power supply voltage swing, namely Vdd/2, is appropriate.

This Schmitt trigger will mask the intermediate voltage levels that may arrive at its inputs, especially because of repeated memory access operations (i.e., multiple reading operations). As long as the input of the inverter remains at a level positioned between its two thresholds, the output of the inverter does not move. This memory effect allows the reading device according to the invention to hold the last piece of data read at the output.

In other words, with an inverter with thresholds, combined with a circuit for precharging the output of the amplifier, if the output signal DATAOUT of the device has switched to a logic 1, it can switch to a logic 0 only if the output signal of the amplifier falls below the low threshold of the inverter with thresholds, i.e., typically Vdd/4. During the precharging phase that follows a reading phase, the output level DATAOUT thus remains at the previously read level. There is no longer any indeterminate data and output. The same reasoning applies to the high threshold.

Figure 5:
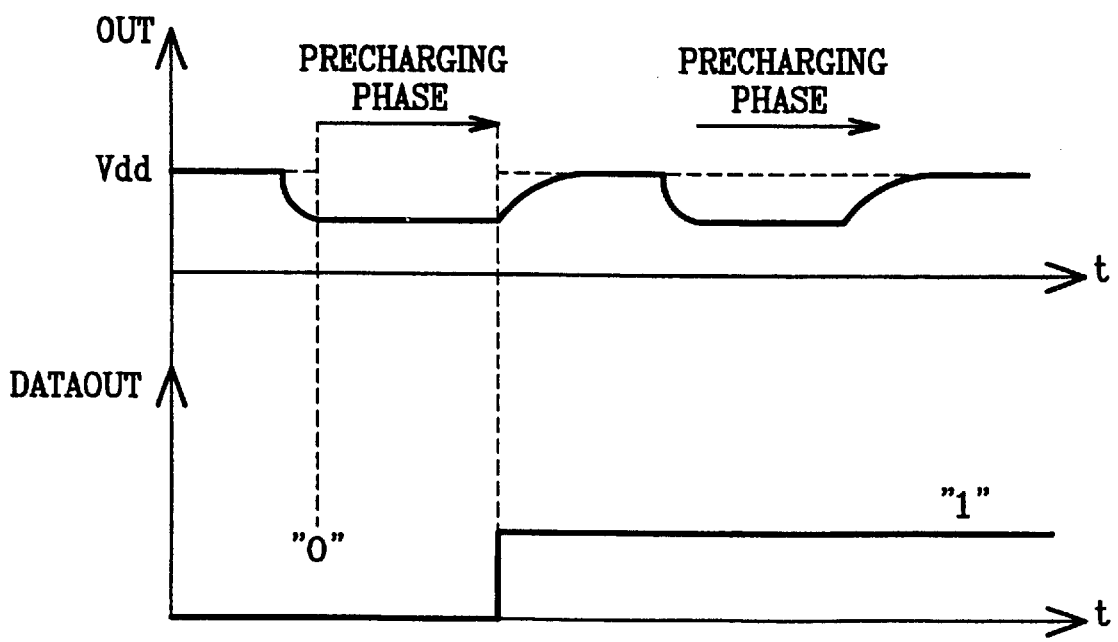
FIG. 5 is a timing diagram of the signals corresponding to the device of FIG. 4 during two successive readings at the same address.

With a reading device of this kind, if reading is done twice at the same memory address, the output data DATAOUT of the inverter with thresholds no longer moves, as in the example shown in FIG. 5. It remains at a logic 1. This is the memory effect of the inverter with thresholds. The output OUT of the threshold amplifier returns to its precharging level Vdd/2 between the two successive cycles (as in FIG. 3).

A reading device according to the invention can therefore be used to improve reading speed and eliminate voltage glitches in the data read at output. This improves the data-processing by the user circuit (namely the processor) that uses this data.

That which is claimed is:

1. A memory cell reading device comprising:
   a differential amplifier having a first input connected to a memory cell to be read and a second input connected to a reference cell associated with the memory cell to be read; and
   a precharging circuit connected to an output of said differential amplifier for precharging the output to a predetermined voltage level during a reading phase of the memory cell, said precharging circuit comprising
   an upper arm comprising a PMOS transistor configured as a diode, and an activation PMOS transistor connected to said PMOS transistor and being controlled by a first precharging signal, and
   a lower arm connected to said upper arm and comprising an NMOS transistor configured as a diode, and an activation NMOS transistor connected to said NMOS transistor and being controlled by a second precharging signal.

2. A memory cell reading device according to claim 1, further comprising a balancing circuit connected between the first and second inputs of said differential amplifier, said balancing circuit for balancing the first and second inputs when said precharging circuit is activated in a precharging phase.

3. A memory cell reading device according to claim 2, wherein said precharging circuit is deactivated after the first and second inputs have been balanced and said balancing circuit has been deactivated.

4. A memory cell reading device according to claim 1, wherein the predetermined voltage level corresponds to an intermediate level between a high logic level and a low logic level.

5. A memory cell reading device according to claim 1, further comprising an inverter having a high threshold and a low threshold connected to the output of said differential amplifier; and wherein the predetermined voltage level corresponds to an intermediate level between the high and low thresholds.

6. A memory cell reading device according to claim 1, wherein the predetermined voltage level corresponds to half of a voltage swing between high and low logic levels.

7. A memory cell reading device comprising:
   a differential amplifier having a first input connected to a memory cell to be read and a second input connected to a reference cell associated with the memory cell to be read;
   a balancing circuit connected between the first and second inputs of said differential amplifier; and
   a precharging circuit connected to an output of said differential amplifier for precharging the output to a predetermined voltage level during a reading phase of the memory cell, said precharging circuit comprising
   an upper arm comprising a PMOS transistor configured as a diode, and an activation PMOS transistor connected to said PMOS transistor and being controlled by a first precharging signal, and
   a lower arm connected to said upper arm and comprising a an NMOS transistor configured as a diode, and an activation NMOS transistor connected to said NMOS transistor and being controlled by a second precharging signal.

8. A memory cell reading device according to claim 7, wherein said balancing circuit balances the first and second inputs when said precharging circuit is activated in a precharging phase.

9. A memory cell reading device according to claim 7, wherein said precharging circuit is deactivated after the first and second inputs have been balanced and said balancing circuit has been deactivated.

10. A memory cell reading device according to claim 7, wherein the predetermined voltage level corresponds to an intermediate level between a high logic level and a low logic level.

11. A memory cell reading device according to claim 7, further comprising an inverter having a high threshold and a low threshold connected to the output of said differential amplifier; and wherein the predetermined voltage level corresponds to an intermediate level between the high and low thresholds.

12. A memory cell reading device according to claim 7, wherein the predetermined voltage level corresponds to half of a voltage swing between high and low logic levels.

13. A memory comprising:
   a plurality of memory cells;
   at least one reference cell; and
   a memory cell reading device connected to said plurality of memory cells and to said at least one reference cell, said memory cell reading device comprising
   at least one differential amplifier having a first input connected to a memory cell to be read and a second input connected to said at least one reference cell, and
   at least one precharging circuit connected to an output of said at least one differential amplifier for precharging the output to a predetermined voltage level during a reading phase of the selected memory cell, said at least one precharging circuit comprising
   an upper arm comprising a PMOS transistor configured as a diode, and an activation PMOS transistor connected to said PMOS transistor and being controlled by a first precharging signal, and
   a lower arm connected to said upper arm and comprising an NMOS transistor configured as a diode, and an activation NMOS transistor connected to said NMOS transistor and being controlled by a second precharging signal.

14. A memory according to claim 13, wherein said plurality of memory cells are configured so that the memory is a static random access memory (SRAM).

15. A memory according to claim 13, wherein said memory cell reading device further comprises at least one balancing circuit connected to said at least one differential amplifier for balancing the first and second inputs when said at least one precharging circuit is activated in a precharging phase.

16. A memory according to claim 13, wherein said at least one precharging circuit is deactivated after the first and second inputs have been balanced and said at least one balancing circuit has been deactivated.

17. A memory according to claim 13, wherein the predetermined voltage level corresponds to an intermediate level between a high logic level and a low logic level.

18. A memory according to claim 13, wherein said memory cell reading device further comprises at least one inverter connected to the output of said at least one differential amplifier, said at least one inverter having a high threshold and a low threshold; and wherein the predetermined voltage level corresponds to an intermediate level between the high and low thresholds.

19. A memory according to claim 13, wherein the predetermined voltage level corresponds to half of a voltage swing between high and low logic levels.

20. A method for reading a memory cell having associated therewith a reference cell, and a differential amplifier having a first input connected to the memory cell and a second input connected to the reference cell, the method comprising:

precharging an output of the differential amplifier to a predetermined voltage level during a reading phase of the memory cell using a precharging circuit connected to the output of the differential amplifier, the precharging circuit comprising an upper arm comprising a PMOS transistor configured as a diode, and an activation PMOS transistor connected to the PMOS transistor and being controlled by a first precharging signal, and a lower arm connected to the upper arm and comprising an NMOS transistor configured as a diode, and an activation NMQS transistor connected to the NMOS transistor and being controlled by a second precharging signal;

balancing the first and second inputs of the differential amplifier during a precharging phase using a balancing circuit connected between the first and second inputs of the differential amplifier; and deactivating the precharging circuit after the first and second inputs have been balanced and the balancing circuit has been deactivated.

21. A method according to claim 20, wherein the predetermined voltage level corresponds to an intermediate level between a high logic level and a low logic level.

22. A method according to claim 20, further comprising an inverter having a high threshold and a low threshold connected to the output of the differential amplifier; and wherein the predetermined voltage level corresponds to an intermediate level between the high and low thresholds.

23. A method according to claim 20, wherein the predetermined voltage level corresponds to half of a voltage swing between high and low logic levels.

* * * * *